(12) United States Patent
Pu et al.

(10) Patent No.: US 10,290,514 B2
(45) Date of Patent: May 14, 2019

(54) ELECTRONIC PRODUCT AND MANUFACTURING METHOD THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventors: Yi-Feng Pu, Taipei (TW); Po-Yu Cheng, Taipei (TW); Tzu-Shu Lin, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/696,346

(22) Filed: Sep. 6, 2017

(65) Prior Publication Data

US 2018/0211848 A1    Jul. 26, 2018

(30) Foreign Application Priority Data

Jan. 26, 2017   (CN) .......................... 2017 1 0061653

(51) Int. Cl.
*H05K 1/18*       (2006.01)
*H05K 3/30*       (2006.01)
(Continued)

(52) U.S. Cl.
CPC ............ *H01L 21/565* (2013.01); *H01L 21/56* (2013.01); *H01L 23/3135* (2013.01);
(Continued)

(58) Field of Classification Search
CPC ............... H01L 21/565; H01L 23/3121; H01L 23/3135; H05K 3/284; H05K 3/1283;
(Continued)

(56) References Cited

U.S. PATENT DOCUMENTS 10,076,040 B2 *   9/2018   Pu .......................... H05K 3/284
2015/0076536 A1   3/2015   Ou et al.
(Continued)

OTHER PUBLICATIONS

Non-Final Office Action issued in U.S. Appl. No. 15/869,303, filed Jan. 12, 2018, dated Aug. 9, 2018.
(Continued)

*Primary Examiner* — Caleen O Sullivan
(74) *Attorney, Agent, or Firm* — McClure, Qualey & Rodack, LLP (57) ABSTRACT

An electronic product including a supporting structure, a first thermo-formable film, a conductive circuit and a protection layer is provided. The conductive circuit is formed on the first thermo-formable film, and an electronic component is mounted on the conductive circuit. The protection layer covers the electronic component, and includes a second thermo-formable film. The conductive circuit and the electronic component are enclosed between the first thermo-formable film and the second thermo-formable film, and the supporting structure, the first thermo-formable film and the protection layer are bonded and stacked to each other.

6 Claims, 13 Drawing Sheets

(51) Int. Cl.
  *H05K 3/28* (2006.01)
  *H05K 1/02* (2006.01)
  *H05K 3/12* (2006.01)
  *H01L 21/56* (2006.01)
  *H01L 23/31* (2006.01)

(52) U.S. Cl.
  CPC ........... *H05K 1/0209* (2013.01); *H05K 1/185* (2013.01); *H05K 3/1275* (2013.01); *H05K 3/1283* (2013.01); *H05K 3/284* (2013.01); *H05K 3/30* (2013.01); *H01L 23/3121* (2013.01); *H05K 2203/1105* (2013.01); *H05K 2203/1377* (2013.01)

(58) Field of Classification Search
  CPC ...... H05K 3/1275; H05K 1/0209; H05K 3/30; H05K 1/185; H05K 2203/1105; H05K 2203/1377

USPC .......................................................... 257/790
  See application file for complete search history.

(56) References Cited

U.S. PATENT DOCUMENTS

| | | |
|---|---|---|
| 2015/0221623 A1 | 8/2015 | Tischler et al. |
| 2016/0138774 A1 | 5/2016 | Joo et al. |
| 2016/0276236 A1 | 9/2016 | Bang et al. |
| 2018/0209615 A1* | 7/2018 | Pu .................. F21V 19/002 |

OTHER PUBLICATIONS

Non-Final Office Action issued in U.S. Appl. No. 15/696,369, filed Sep. 6, 2017, dated Jul. 31, 2018.

Non-Final Office Action issued in U.S. Appl. No. 15/869,303, filed Jan. 12, 2018, dated Feb. 21, 2019.

\* cited by examiner

ELECTRONIC PRODUCT AND MANUFACTURING METHOD THEREOF

This application claims the benefit of People's Republic of China application Serial No. 201710061653.4, filed Jan. 26, 2017, the disclosure of which is incorporated by reference therein in its entirety.

TECHNICAL FIELD

The disclosure relates in general to a product and a manufacturing method thereof, and more particularly to an electronic product and a manufacturing method thereof.

BACKGROUND

According to the currently used method for manufacturing a water-proof and dust-proof electronic product, there is normally a rubber strip enclosed between two plastic casings covering an electronic component and then the rubber strip is laminated with the two plastic casings by pressure to avoid external moisture and dust entering the interior of the two plastic casings. However, such method still cannot guarantee a 100% water-proof effect, and moisture may infiltrate via gap between the plastic casings and the rubber strip and cause damage to the electronic component. Another method for manufacturing an electronic product is to use an in-mold forming technology. An electronic component is firstly mounted on a film, and then the film with the electronic component is placed in an injection mold. Then, a melted plastic material is injected into the injection mold, such that the melted plastic material and the film with the electronic component are bonded together. Although such method may achieve a water-proof effect, the yield rate of the injection method is low, and the electronic component disposed on the film still may be collided by the injected plastics and become damaged.

SUMMARY

The disclosure is directed to an electronic product and a manufacturing method thereof. An electronic component and a conductive circuit can be tightly enclosed between a protection layer and a laminated layer, which are bonded together, and then the laminated layer, the protection layer and a supporting structure are bonded and stacked by using an in-mold forming technology or an out-mold forming technology to enhance the protection for the electronic component. Moreover, the laminated layer and/or the protection layer can adaptively contain at least one function film to fit actual needs.

According to one embodiment, an electronic product is provided. The electronic product includes a supporting structure, a first thermo-formable film, a conductive circuit and a protection layer. The conductive circuit is formed on the first thermo-formable film, and an electronic component is displaced on the conductive circuit. The protection layer covers the electronic component, and includes a second thermo-formable film. The conductive circuit and the electronic component are enclosed between the first thermo-formable film and the second thermo-formable film, and the supporting structure, the first thermo-formable film and the protection layer are bonded and stacked to each other.

According to another embodiment, a manufacturing method of an electronic product is provided. The manufacturing method includes following steps. A conductive circuit is formed on a first thermo-formable film. An electronic component is mounted on the conductive circuit. A protection layer is formed on the first thermo-formable film and covers the electronic component, wherein the protection layer comprises a second thermo-formable film, and the conductive circuit and the electronic component are enclosed between the first thermo-formable film and the second thermo-formable film. A supporting structure is formed, and the supporting structure, the first thermo-formable film and the protection layer are bonded and stacked to each other.

The above and other aspects of the invention will become better understood with regard to the following detailed description of the preferred but non-limiting embodiment(s). The following description is made with reference to the accompanying drawings.

DETAILED DESCRIPTION

Detailed descriptions of the invention are disclosed below with a number of embodiments. However, the disclosed embodiments are for explanatory and exemplary purposes only, not for limiting the scope of protection of the invention.

Figure 1A:
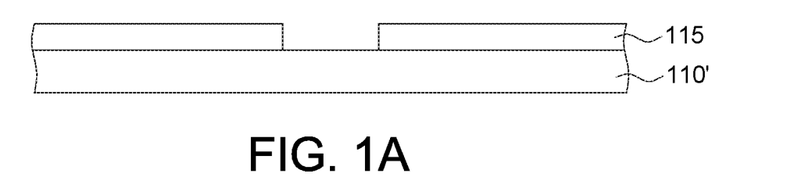
FIGS. 1A-1C are schematic diagrams of forming a conductive circuit by way of hot stamping according to a first embodiment of the invention.
Figure 1B:
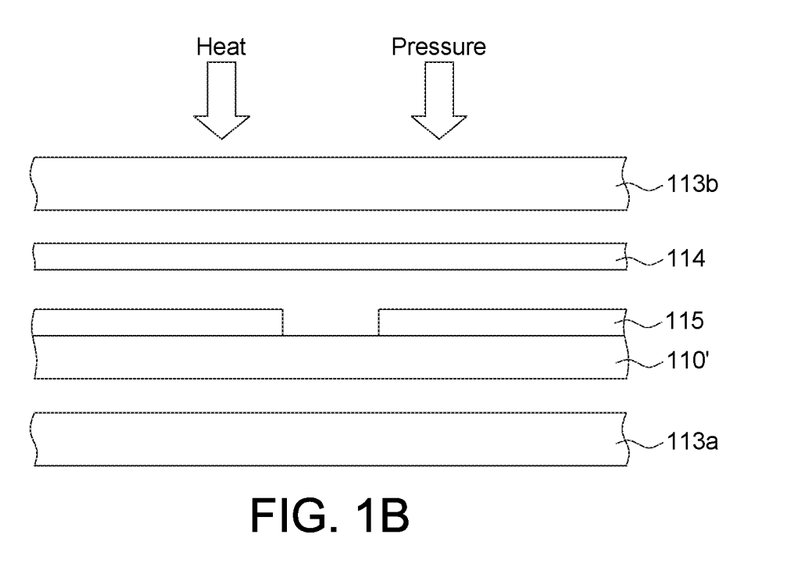
Figure 1C:
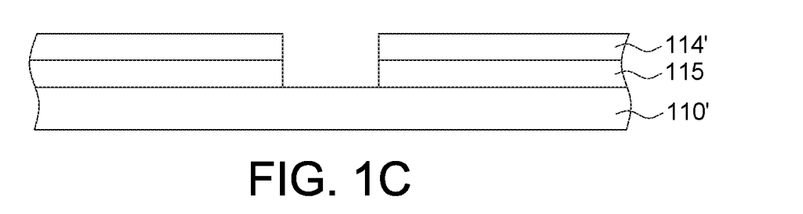

Refer to FIGS. 1A~1C. The method for forming a conductive circuit 114' by way of hot stamping according to a first embodiment of the invention includes following steps. As indicated in FIG. 1A, a patterned ink layer 115 is formed on a polymer film 110' by a printing or transferring process. The ink may contain at least one conductive powder (such as $F-Fe_3O_4$ crystalline powders), at least one polymer resin, a charge regulator, a flow agent and at least one surface modifier. Then, as indicated in FIG. 1B, stamping plates 113a and 113b are formed of metal (such as zinc or copper). Firstly, before the hot stamping process is performed, the stamping plate 113b is heated by a heater, and the stamping plate 113a may be heated by a heater to increase the uniformity of heat, but also may not be heated and just used for fixing. Then, the conductive metal layer 114 is placed on the patterned ink layer 115 and is heated and pressed through the stamping plate 113b disposed above the conductive metal layer 114, such that a part of the conductive metal layer 114 is heated and fixed on the patterned ink layer 115 to form the conductive circuit 114', and the remaining part of the conductive metal layer 114 not forming the conductive circuit 114' is removed by a brush or a scraper. As indicated in FIG. 1C, after hot stamping, a part of the conductive metal layer 114 is fixed on the polymer film 110' having the patterned ink layer 115 to form the conductive circuit 114' having a circuit pattern on the polymer film 110'.

Figure 2A:
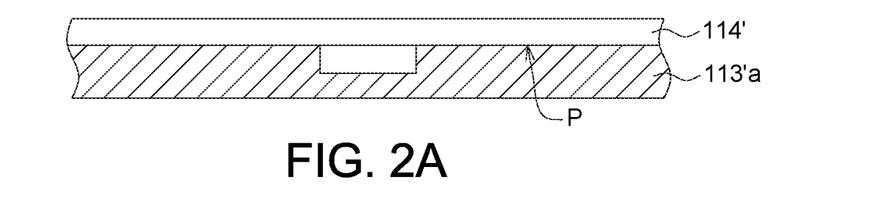
FIGS. 2A-2C are schematic diagrams of forming a conductive circuit by way of hot stamping according to a second embodiment of the invention.
Figure 2B:
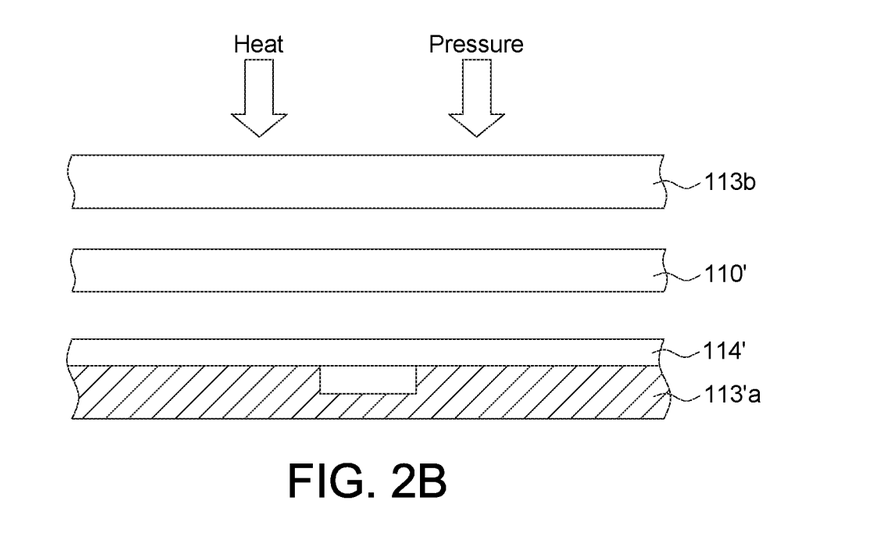
Figure 2C:
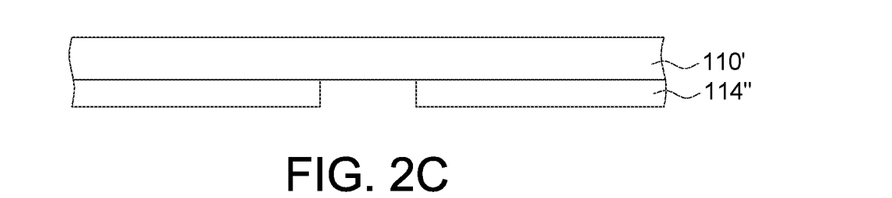

Refer to FIGS. 2A-2C. The method for forming a conductive circuit 114" by way of hot stamping according to an embodiment of the invention includes following steps. As indicated in FIG. 2A, a conductive metal layer 114' is formed on a Toppan stamping plate 113'a, and a circuit pattern is formed through the protrusion P of the Toppan stamping plate 113'a, and the conductive metal layer 114' contains an adhesive which provides the conductive metal layer 114' with viscosity. As indicated in FIG. 2B, firstly, before the hot stamping process is performed, the Toppan stamping plate 113'a is heated by a heater, and the stamping plate 113b may be heated to increase the uniformity of heat, but also may not be heated and just used for fixing. Then, a polymer film 110' is placed on the conductive metal layer 114', and is heated and pressed through the Toppan stamping plate 113'a for transferring the heat to the conductive metal layer 114' to heat and melt the adhesive, such that a part of the conductive metal layer 114' is fixed on the polymer film 110' by the melted adhesive. As indicated in FIG. 2C, after hot stamping, a part of the conductive metal layer 114' forms the conductive circuit 114" having the circuit pattern on the polymer film 110'.

Figure 3A:
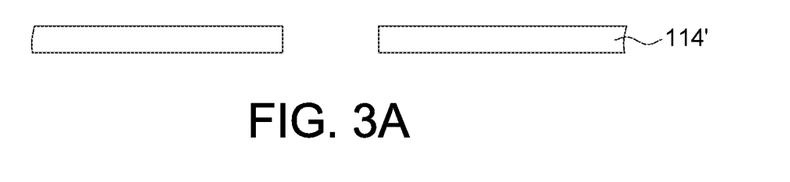
FIGS. 3A-3C are schematic diagrams of forming a conductive circuit by way of hot stamping according to a third embodiment of the invention.
Figure 3B:
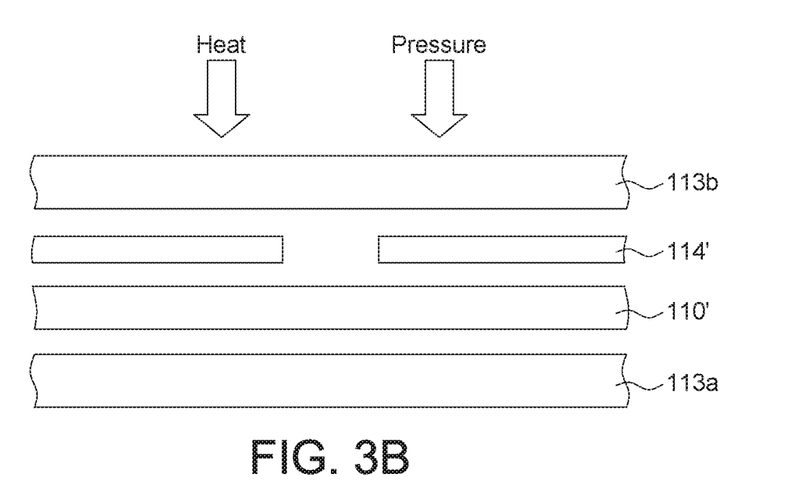
Figure 3C:
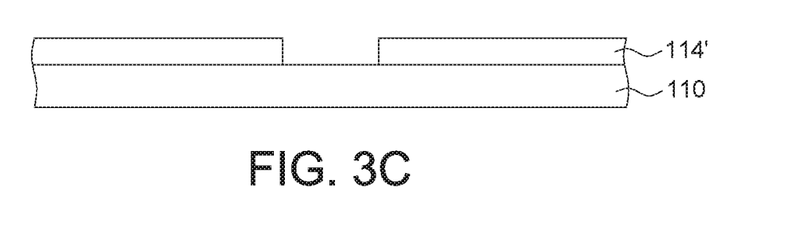

Refer to FIGS. 3A-3C. The method for forming a conductive circuit 114" by way of hot stamping according to an embodiment of the invention includes following steps. As indicated in FIG. 3A, a conductive metal layer 114' having a circuit pattern is formed, and the conductive metal layer 114' contains an adhesive, which provides the conductive metal layer 114' with viscosity. Then, as indicated in FIG. 3B, firstly, before the hot stamping process is performed, the stamping plate 113b is heated by a heater, and the stamping plate 113a may be heated to increase the uniformity of heat, but also may not be heated and just used for fixing. Then, the conductive metal layer 114' is heated and pressed through the stamping plate 113b disposed above the conductive metal layer 114' to heat and melt the adhesive, such that the conductive metal layer 114' having the circuit pattern is fixed on the polymer film 110' by the melted adhesive. As indicated in FIG. 3C, after hot stamping, the conductive metal layer 114' forms the conductive circuit 114" having the circuit pattern on the polymer film 110'.

Figure 4A:
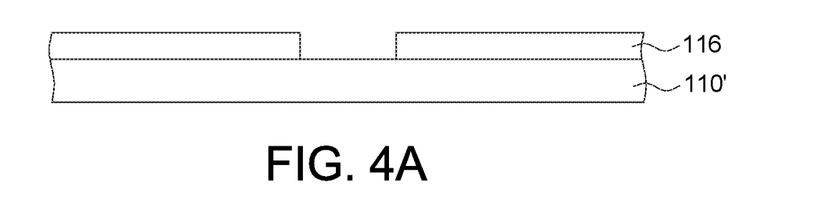
FIGS. 4A-4C are schematic diagrams of forming a conductive circuit by way of cold stamping according to a fourth embodiment of the invention.
Figure 4B:
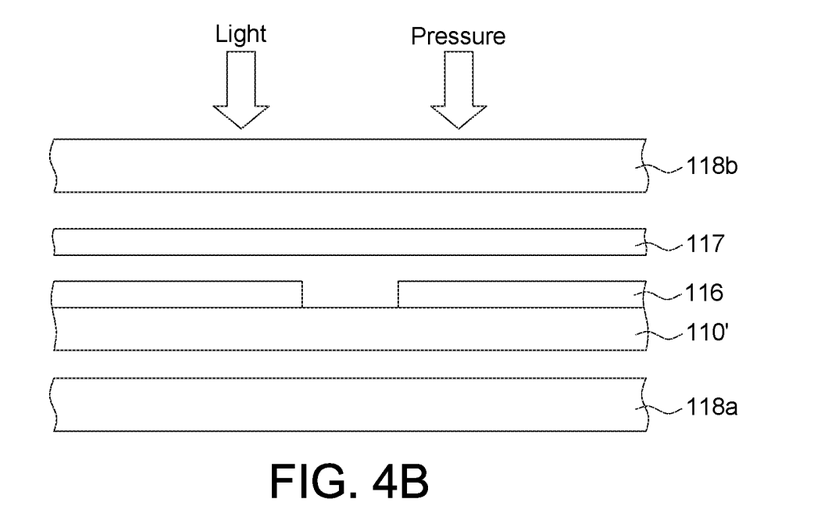
Figure 4C:
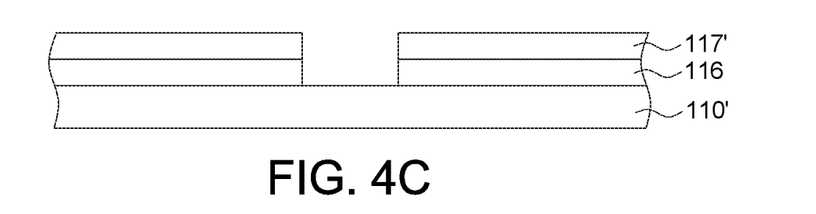

Refer to FIGS. 4A-4C. The method for forming a conductive circuit 117' by way of cold stamping according to an embodiment of the invention includes following steps. As indicated in FIG. 4A, a patterned adhesive layer 116 (such as a UV curing adhesive) is formed on a polymer film 110' by way of printing or adhering. As indicated in FIG. 4B, a conductive metal layer 117 is disposed on the patterned adhesive 116. The polymer film 110' and the conductive metal layer 117 are placed between the pressure plates 118a and 118b and are pressed through the pressure plate 118b, such that a part of the conductive metal layer 117 is pressed and fixed on the patterned adhesive layer 116 to form the conductive circuit 117', the patterned adhesive layer 116 is irradiated by a UV light and cured, and the remaining part of the conductive meal layer 117 not forming the conductive circuit 117' is removed by a brush or a scraper. As indicated in FIG. 4C, after cold stamping, a part of the conductive metal layer 117 is fixed on the polymer film 110' having the patterned adhesive layer 116 to form the polymer film 110' having the conductive circuit 117'.

Figure 5A:
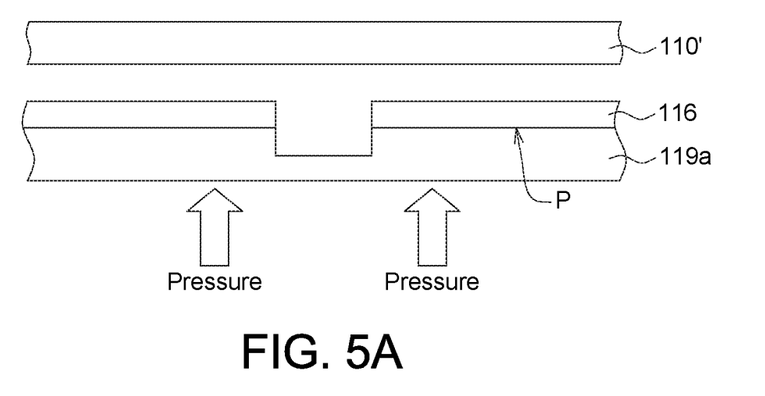
FIGS. 5A-5C are schematic diagrams of forming a conductive circuit by way of cold stamping according to a fifth embodiment of the invention.
Figure 5B:
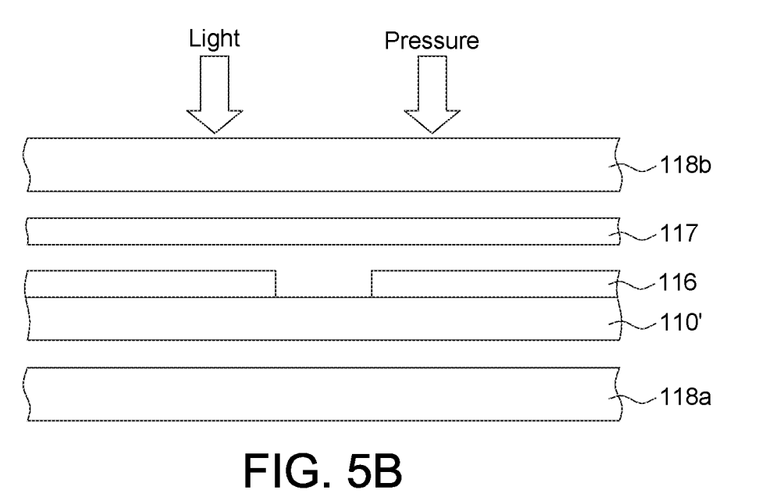
Figure 5C:
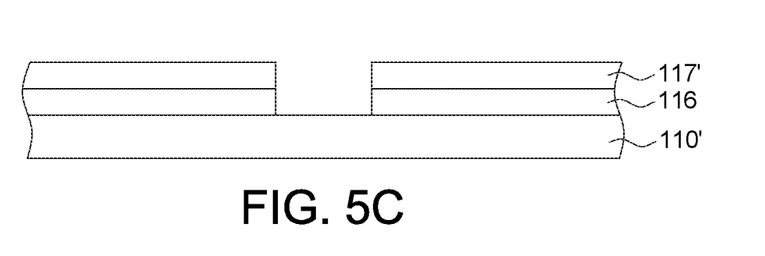

Refer to FIGS. 5A-5C. The method for forming a conductive circuit 117' by way of cold stamping according to an embodiment of the invention includes following steps. As indicated in FIG. 5A, an adhesive layer 116 (such as a UV curing adhesive) is adhered on a protrusion P of a Toppan pressure plate 119a. A circuit pattern is formed through the protrusion P of the Toppan pressure plate 119a to form the pattern of the patterned adhesive layer 116. Then, the polymer film 110' is placed on the patterned adhesive layer 116, and the patterned adhesive layer 116 is transferred to the polymer film 110' by way of pressing. As indicated in FIG. 5B, the conductive metal layer 117 is disposed on the patterned adhesive layer 116 and is pressed through the pressure plates 118a and 118b, such that a part of the conductive metal layer 117 is pressed and fixed on the patterned adhesive layer 116 to form the conductive circuit 117'. The patterned adhesive layer 116 is irradiated by a UV light and cured, and the remaining part of the conductive metal layer 117 not forming the conductive circuit 117' is removed by a brush or a scraper. As indicated in FIG. 5C, after cold stamping, a part of the conductive metal layer 117 is fixed on the polymer film 110' having the patterned adhesive layer 116 to form the conductive circuit 117' having the circuit pattern on the polymer film 110'.

Figure 6A:
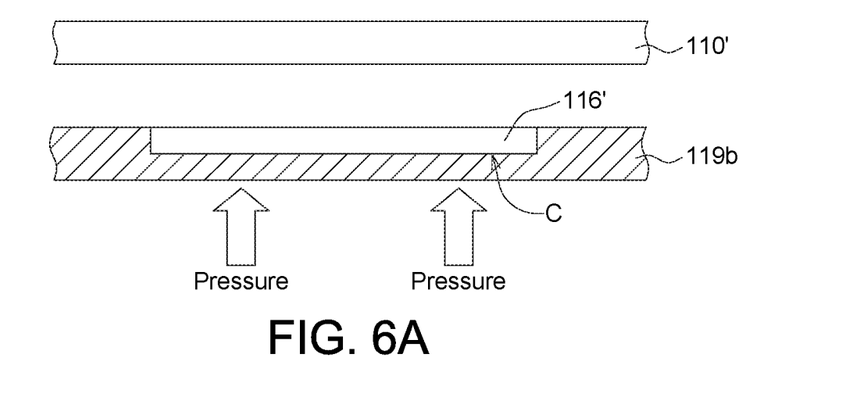
FIGS. 6A-6C are schematic diagrams of forming a conductive circuit by way of cold stamping according to a sixth embodiment of the invention.
Figure 6B:
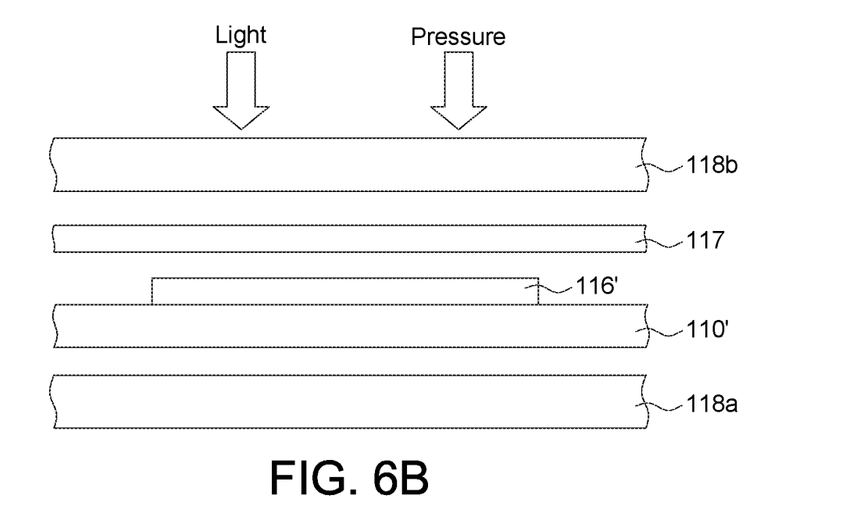
Figure 6C:
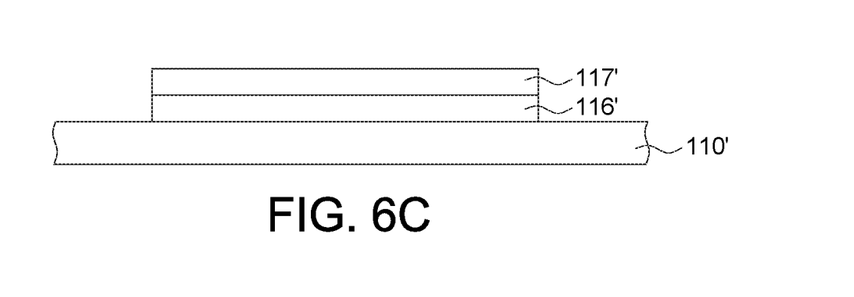

Refer to FIGS. 6A-6C. The method for forming a conductive circuit 117' by way of cold stamping according to an embodiment of the invention includes following steps. As indicated in FIG. 6A, an adhesive layer 116' (such as an UV curing adhesive) is filled into the groove C of the Intaglio pressure plate 119b, and a circuit pattern is formed through the groove C of the Intaglio pressure plate 119 to form the pattern of the patterned adhesive layer 116', the polymer film 110' is placed on the patterned adhesive layer 116', and the patterned adhesive layer 116' is transferred on the polymer film 110' by way of pressing. The conductive metal layer 117 is placed on the patterned adhesive layer 116', and the conductive metal layer 117 enclosed between the pressure plates 118a and 118b is pressed through the pressure plate 118b, such that a part of the conductive metal layer 117 is pressed and fixed on the patterned adhesive 116' to form the conductive circuit 117'. The patterned adhesive 116 is irradiated by a UV light and cured, and the remaining part of the conductive metal layer 117 not forming the conductive circuit 117' is removed by a brush or a scraper. As indicated in FIG. 6C, after cold stamping, a part of the conductive metal layer 117 is fixed on the polymer film 110' having the patterned adhesive layer 116' to form the conductive circuit 117' having the circuit pattern on the polymer film 110'.

Figure 7A:
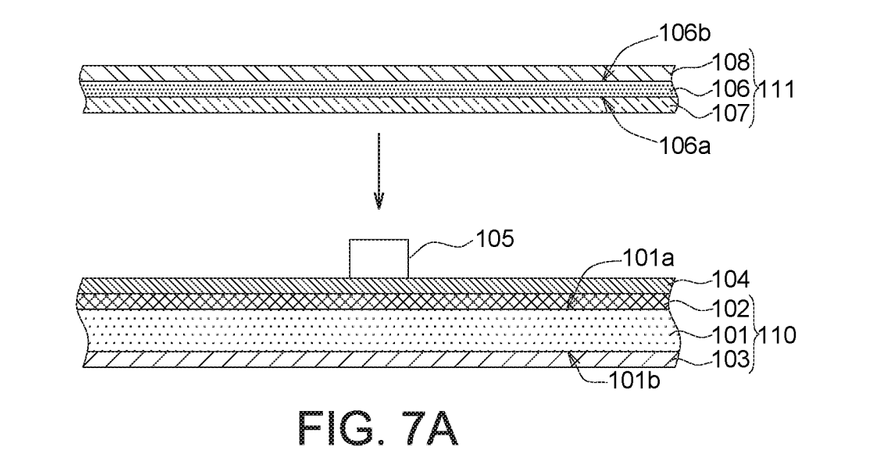
FIGS. 7A-7C are diagrams of a manufacturing method of an electronic product according to an embodiment of the invention.
Figure 7B:
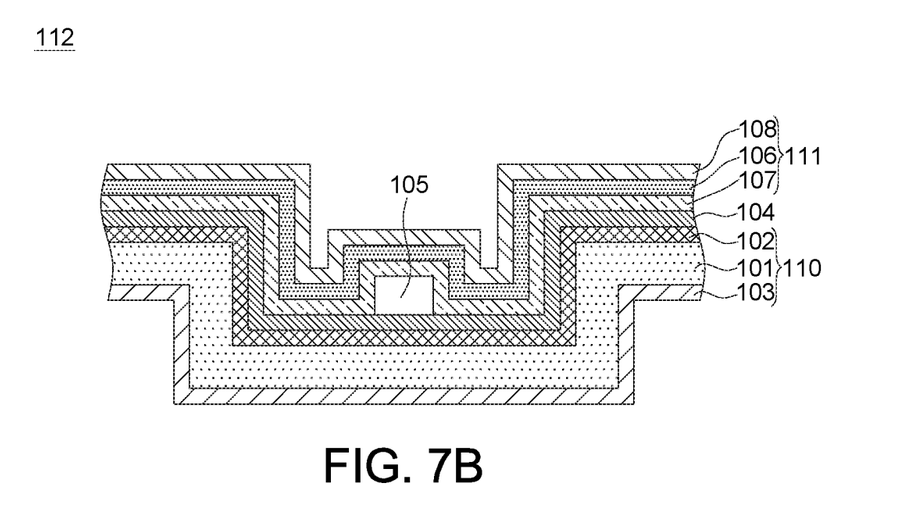
Figure 7C:
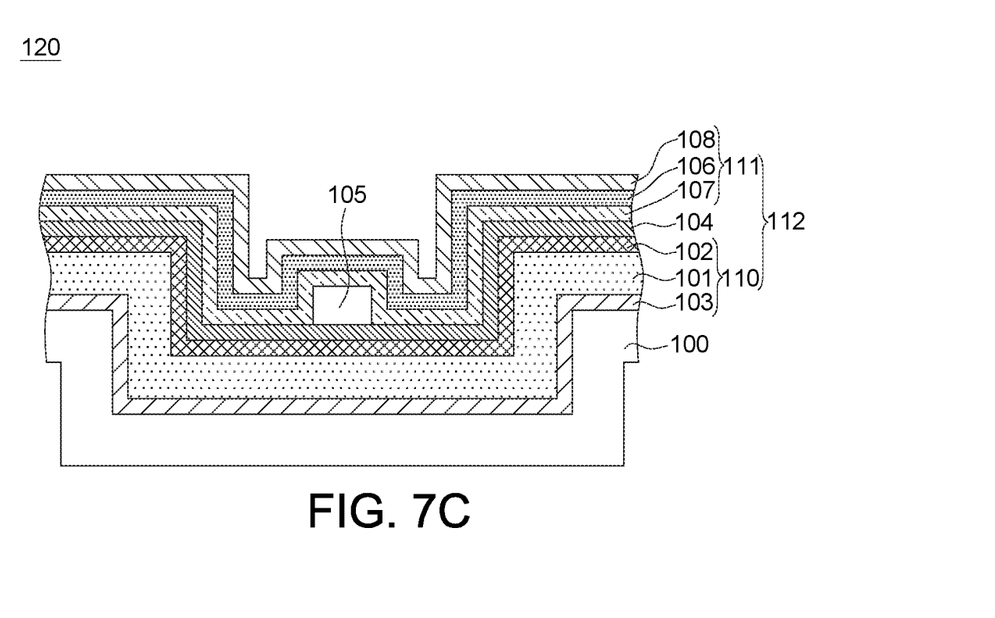

Refer to FIGS. 7A-7C. The method for manufacturing an electronic product 120 according to an embodiment of the invention includes following steps:

As indicated in FIG. 7A, a conductive circuit 104 is formed on a laminated layer 110. The conductive circuit 104 may be formed of a conductive ink or any conductive metals. The conductive ink is formed on a surface of the laminated layer 110 by printing. The conductive metal is formed on a surface of the laminated layer 110 by way of hot stamping disclosed in FIGS. 1A-1C, FIGS. 2A-2C or FIGS. 3A-3C, or is formed on a surface of the laminated layer 110 by way of cold stamping disclosed in FIGS. 4A-4C, FIGS. 5A-5C or FIGS. 6A-6C. Then, an electronic component 105 is formed on the conductive circuit 104, that is, the electronic component 105 can be electrically connected to another electronic component or another electronic device through the conductive circuit 104 formed by way of hot stamping or cold stamping for transmitting electronic signals. In the hot stamping process disclosed above, the sequence for heating and pressing the stamping plates 113a and 113b is not limited to the sequence exemplified in the embodiments of FIGS. 1A-1C, FIGS. 2A-2C or FIGS. 3A-3C, and other variations of the steps of heating and pressing the conductive metal by the stamping plate either directly or indirectly can also be used. In the cold stamping process disclosed above, the sequence for pressing of the pressure plates 118a and 118b is not limited to the sequence exemplified in the embodiments of FIGS. 4A-4C, FIGS. 5A-5C or FIGS. 6A-6C, and other variations of the steps of pressing the conductive metal by the pressure plate either directly or indirectly can also be used. The conductive metal can be realized by any conductive metal foils, such as gold, silver, copper, iron, aluminum, nickel, zinc. Besides, the electronic component 105 can be realized by an integrated circuit (IC) component including active and/or passive elements, such as transistors, diodes, capacitors, and resistors. The active and/or passive elements can be integrated on a semiconductor chip to form a household or industrial IC. All the home appliances, consumer electronic products or vehicle electronic products can process signals using the electronic component 105. In an embodiment, the electronic component 105 can be electrically connected to the conductive circuit 104 by using a conductive paste or by way of soldering for transmitting or receiving electronic signals.

In an embodiment, the laminated layer 110 at least includes a thermo-formable film 101, which can be a polymer film and can be heated and deformed under certain conditions of temperature, vacuum and pressure. In the present embodiment, the thermo-formable film 101 provides waterproof and dustproof functions to avoid the electronic component 105 being affected by moisture or dusts. In other embodiment, the laminated layer 110 may further include at least one function film which conducts the heat generated by the electronic component 105 to the external of the electronic component 105 or avoid the electronic component 105 being interfered with by electromagnetic waves. Moreover, the laminated layer 110 may further include a decorative layer for decorating the external appearance of the electronic product, such that the external appearance of the electronic product 120 can have metal texture, glossy surface, pattern decoration or versatile colors. Depending on the needs of use, in other embodiments, the laminated layer 110 may include other function films, such as a light diffusion layer, which increases optical properties, or a functional layer, which is compatible with a polymer film. The above exemplifications are not subjected to specific restrictions.

As indicated in FIG. 7A, the laminated layer 110 includes a first function film 102, a thermo-formable film 101 and a second function film 103 stacked in sequence. The first function film 102 is located on a first surface 101a of the thermo-formable film 101, the second function film 103 is located on a second surface 101b of the thermo-formable film 101, and the first surface 101a and the second surface 101b are opposite to each other. In an embodiment, the first function film 102 can be at least one of a decorative layer, a heat conducting layer, a shielding layer, and a light diffusion layer. The second function film 103 can be at least one of a decorative layer, a heat conducting layer, a shielding layer, and a light diffusion layer. The first function film 102 and the second function film 103 can have identical or different functions, and are not subjected to specific restrictions. The first function film 102 and the second function film 103 can be formed on any surface of the thermo-formable film 101, such as on the same surface or different surfaces, by way of screen printing, offset printing, gravure printing, flexographic printing, transfer printing, carving printing or other methods, and are not subjected to specific restrictions. The electronic product 120 can have none, one, or both of the first function film 102 and the second function film 103 according to the features of the electronic product 120. It should be noted that the specification of the invention describes the situation with references to FIGS. 7A-7D (or FIGS. 8A-8B or FIGS. 9A~9C or FIGS. 10A~10C) that the electronic product 120 has both the first function film 102 and the second function film 103, and other situations are literally described without using any accompanying drawings.

Refer to FIGS. 7A and 7B. A protection layer 111 is formed on the laminated layer 110 and covers the electronic component 105. The laminated layer 110 and the protection layer 111 can be bonded together to form a composite structure 112 according to a predetermined shape. The composite structure 112 can be processed to have a 2D shape or a 3D shape according to the shape of the electronic product 120. In an embodiment, the laminated layer 110 and the protection layer 111 can be pre-bonded together by using a high temperature vacuum adsorption method, a heat pressing method, or an ultrasonic welding method. In another embodiment, the laminated layer 110 and the protection layer 111 can be pre-bonded together by using an adhering method or an adhesive attaching method.

The protection layer 111 whose structure is similar to the laminated layer 110 and at least includes a thermo-formable film 106, which can be a polymer film and can be heated and deformed under certain conditions of temperature, vacuum and pressure. The thermo-formable films 101 and 106 used in the laminated layer 110 and the protection layer 111 can be formed by polymer compound, such as thermoplastic plastics or thermosetting plastics. The thermoplastic plastics can be heated by multiple thermoforming processes and the thermosetting plastics can only be heated by single thermoforming process. Besides, the thermo-formable films 101 and 106 used in the laminated layer 110 and the protection layer 111 can be formed by the same material or different materials.

Refer to FIG. 7A, the protection layer 111 includes a third function film 107, a thermo-formable film 106 and a fourth function film 108 stacked in sequence. The third function film 107 is located on a first surface 106a of the thermo-formable film 106, the fourth function film 108 is located on a second surface 106b of the thermo-formable film 106, and the first surface 106a and the second surface 106b are opposite to each other. The third function film 107 and the fourth function film 108 are similar to the first function film 102 and the second function film 103 in that each function film can be at least one of a decorative layer, a heat conducting layer, a shielding layer, and the light diffusion layer. It should be noted that the specification of the invention describes the situation with references to FIGS. 7A-7D (or FIGS. 8A~8B or FIGS. 9A~9C or FIGS. 10A~10C) that the third function film 107 and the fourth function film 108 both exist, and other situations are literally described without using any accompanying drawings.

Refer to the electronic product 120 of FIG. 7C. After the laminated layer 110 and the protection layer 111 are bonded together to form a composite structure 112, a supporting structure 100 is formed on the composite structure 112, such that the supporting structure 100, the laminated layer 110 and the protection layer 111 are bonded and stacked to each other. In an embodiment, the supporting structure 100 and the composite structure 112 can be bonded together by using an in-mold injection forming technology. The supporting structure 100 can be formed by a polymer plastic material. The in-mold injection process includes following steps. Firstly, a composite structure 112 having an electronic component 105 is placed in a mold and the polymer plastic material is heated and melted. Then, the polymer plastic material is injected into the mold from the outside of the protection film 110. After the polymer plastic material is cured and forms a shape, the supporting structure 100 required by the electronic product 120 is formed. Meanwhile, the laminated layer 110 is enclosed between the electronic component 105 and the supporting structure 100 by way of injection forming, and therefore can protect the electronic component 105 from colliding with the injected plastics and becoming damaged.

Figure 7D:
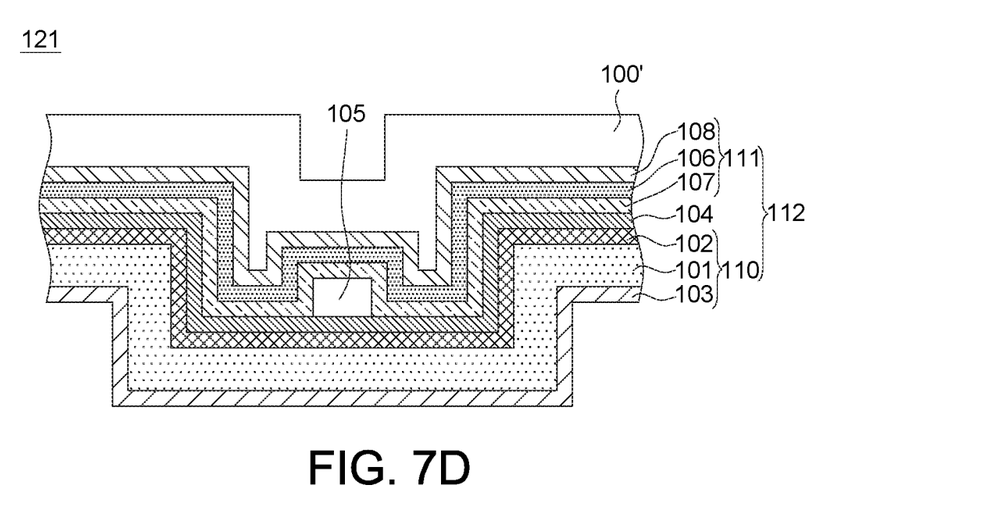
FIG. 7D is a schematic diagram of an electronic product according to another embodiment of the invention.

Refer to the electronic product 121 of FIG. 7D. In another embodiment, when the polymer plastic material is injected into the mold from the outside of the protection layer 111, the protection layer 111 is enclosed between the electronic component 105 and the supporting structure 100' by way of injection forming, and therefore can protect the electronic component 105 from colliding with injected plastics and becoming damaged.

With the protection effect provided by the laminated layer 110 and the protection layer 111, the electronic component 105 of the electronic products 120 and 121 of the invention is tightly enclosed between the laminated layer 110 and the protection layer 111, such that the electronic component 105 can be better encapsulated. As indicated in FIG. 7C, when the protection layer 111 is located on the outmost layer, apart from providing the waterproof and dustproof functions, the protection layer 111 can adaptively provide at least one extra function. For example, the third function film 107 of the protection layer 111 can be a heat conducting layer or a light diffusion layer, and the fourth function film 108 of the protection layer 111 can be a decorative layer or a metal shielding layer. As indicated in FIG. 7D, when the laminated layer 110 is located on the outmost layer, apart from providing the waterproof and dustproof functions, the laminated layer 110 can adaptively provide at least one extra function. For example, the first function film 102 of the laminated layer 110 can be a heat conducting layer or a light diffusion layer, and the second function film 103 of the laminated layer 110 can be a decorative layer or a metal shielding layer.

Figure 8A:
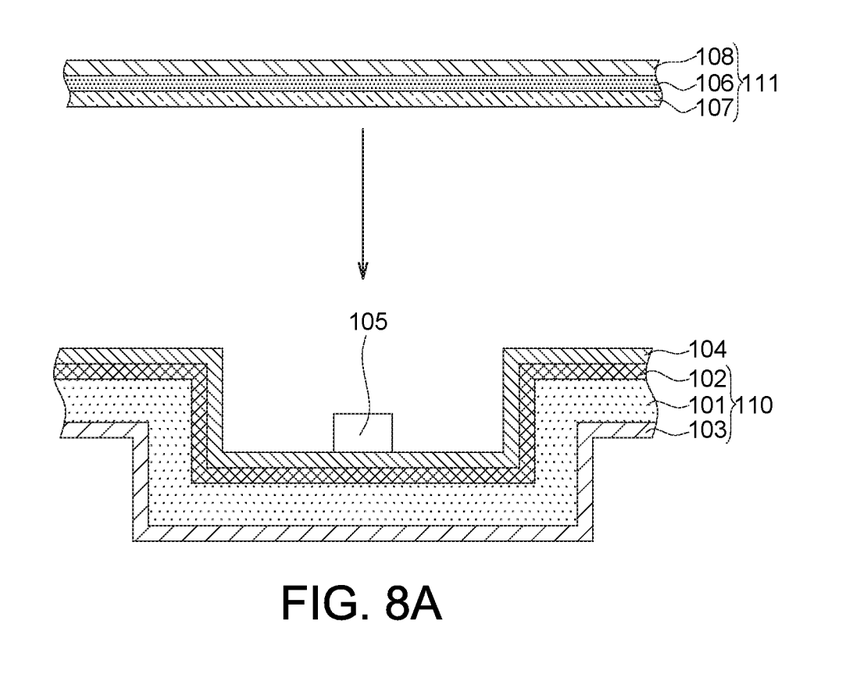
FIGS. 8A-8B are diagrams of a manufacturing method of an electronic product according to an embodiment of the invention.
Figure 8B:
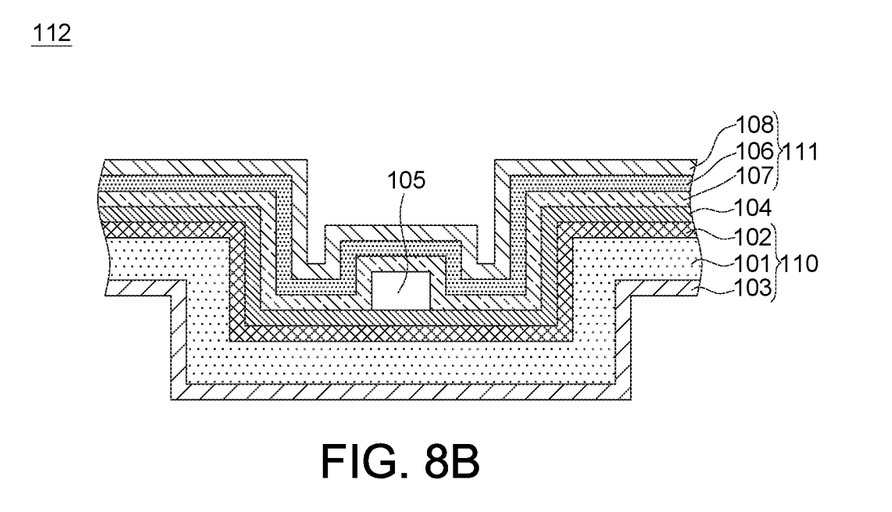

Refer to FIGS. 8A-8B. The manufacturing method illustrated in FIGS. 8A-8B is similar to that illustrated in FIGS. 7A-7B, and the same designations are used to indicate identical or similar elements. However, the two manufacturing methods are different as follows. As indicated in FIG. 8A, after the conductive circuit 104 and the electronic component 105 are formed on the laminated layer 110, a thermoforming process can be performed thereto to form a required structure according to a predetermined shape. Or, after the conductive circuit 104 is formed on the laminated layer 110, a thermoforming process is firstly performed thereto to form a required structure according to a predetermined shape and then the electronic component 105 is disposed on the conductive circuit 104. Then, as indicated in FIG. 8B, the protection layer 111 and the pre-shaped laminated layer 110 are bonded together to form a composite structure 112 by using a high temperature vacuum adsorption method, a heat pressing method, an ultrasonic welding method, an adhering method or an adhesive attaching method. Lastly, the supporting structure 100, formed by using an in-mold injection forming technology, and the laminated layer 110 of the composite structure 112 are bonded together to form an electronic product 120 as indicated in FIG. 7C. In another embodiment, the supporting structure 100', formed by using an in-mold injection forming technology, and the protection layer 111 of the composite structure 112 are bonded together to form an electronic product 121 as indicated in FIG. 7D.

Figure 9A:
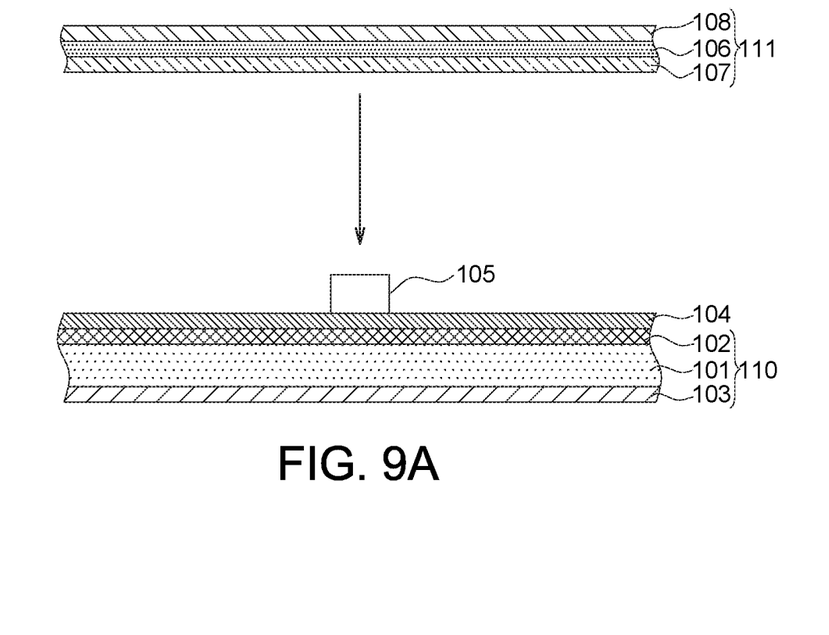
FIGS. 9A-9C are diagrams of a manufacturing method of an electronic product according to an embodiment of the invention.
Figure 9B:
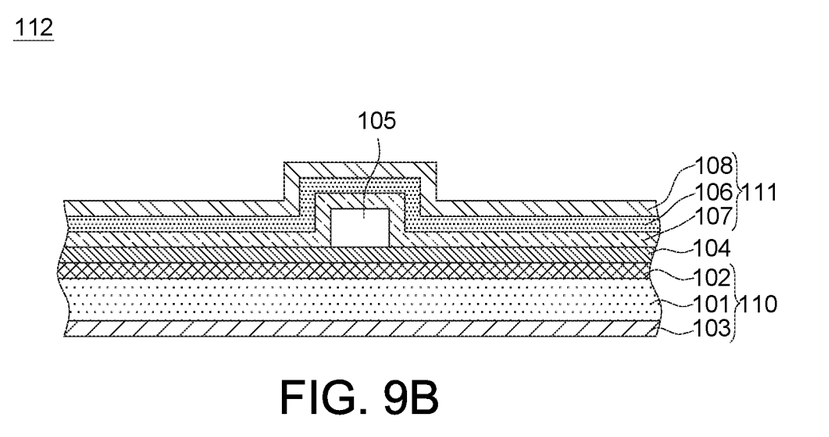
Figure 9C:
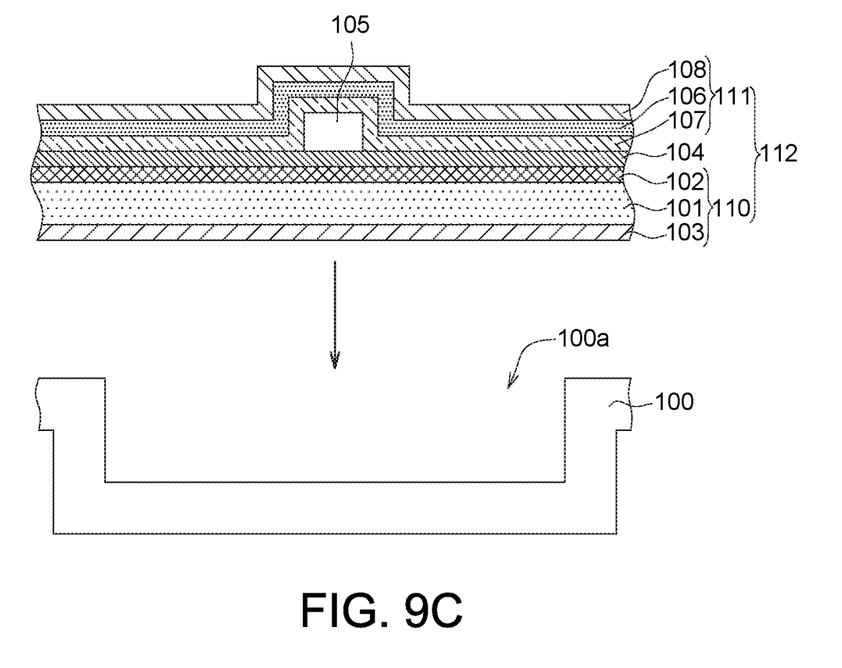

Refer to FIGS. 9A-9C. The manufacturing method of an electronic product illustrated in FIGS. 9A-9C is similar to that illustrated in FIGS. 7A-7D, and the same designations are used to indicate identical or similar elements. However, the two manufacturing methods are different as follows. As indicated in FIG. 9B, after the conductive circuit 104 and the electronic component 105 are formed on the laminated layer 110, the protection layer 111 and the laminated layer 110 can be bonded together by using a high temperature vacuum adsorption method, a heat pressing method, an ultrasonic welding method, an adhering method or an adhesive attaching method to encapsulate the electronic component 105 between the laminated layer 110 and the protection layer 111 and form a composite structure 112, but the protection layer 111 and the laminated layer 110 are not conformal with each other and therefore do not form a required shape. Then, as indicated in FIG. 9C, the unshaped laminated layer 110 and the protection layer 111 of the composite structure 112 and a pre-shaped supporting structure 100 can be bonded together by using an out-mold forming technology, including an out-mold packaging method, a high temperature vacuum adsorption method, a heat pressing method, an ultrasonic welding method, an adhering method or an adhesive attaching method. According to the out-mold packaging method, the polymer film is bonded on the supporting structure 100 under specific conditions of temperature, vacuum and pressure and a positioning system, such that the laminated layer 110 and the protection layer 111 are heated and deformed, and are tightly bonded on the supporting structure 100. In an embodiment, the supporting structure 100 can be formed according to a predetermined shape. For example, the supporting structure 100 can be processed to have a convex-concave shape 100a or other 2D or 3D shape, and the laminated layer 110 of the composite structure 112 and the supporting structure 100 are bonded together to form an electronic product 120 as indicated in FIG. 7C. Or, in another embodiment, the protection layer 111 of the composite structure 112 and the supporting structure 100' are bonded together to form an electronic product 121 as indicated in FIG. 7D.

Figure 10A:
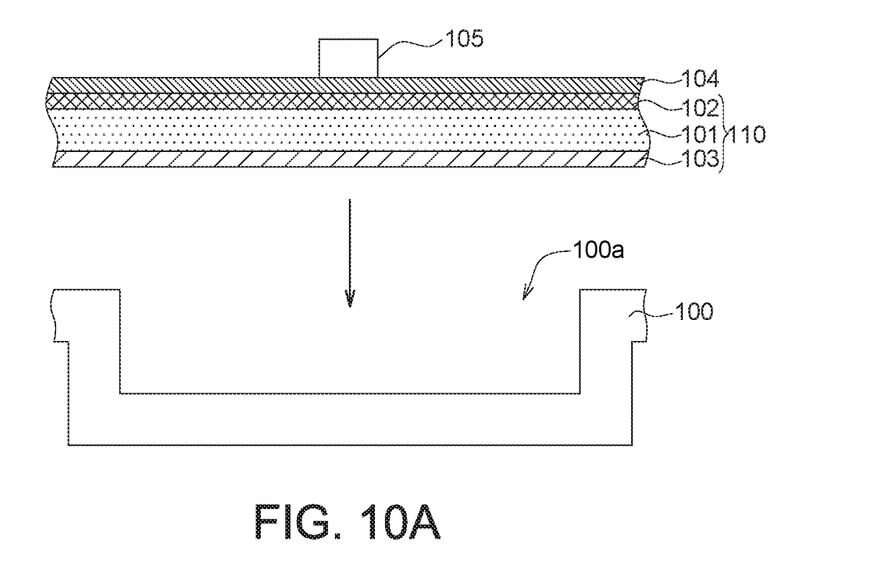
FIGS. 10A-10C are diagrams of a manufacturing method of an electronic product according to an embodiment of the invention.
Figure 10B:
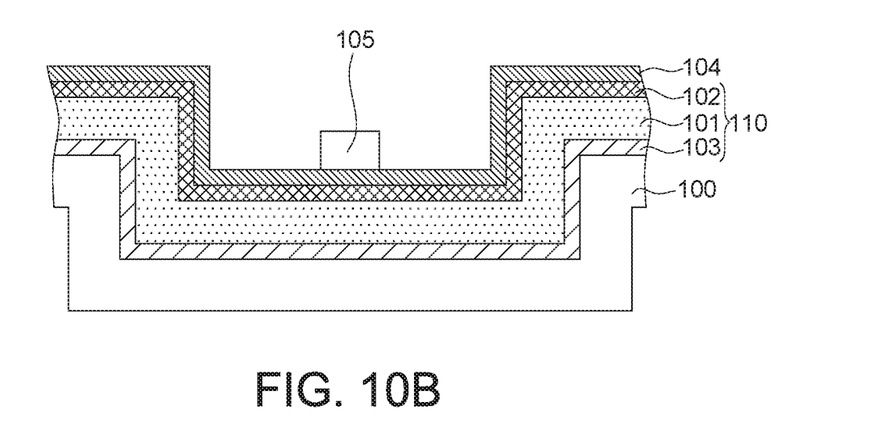
Figure 10C:
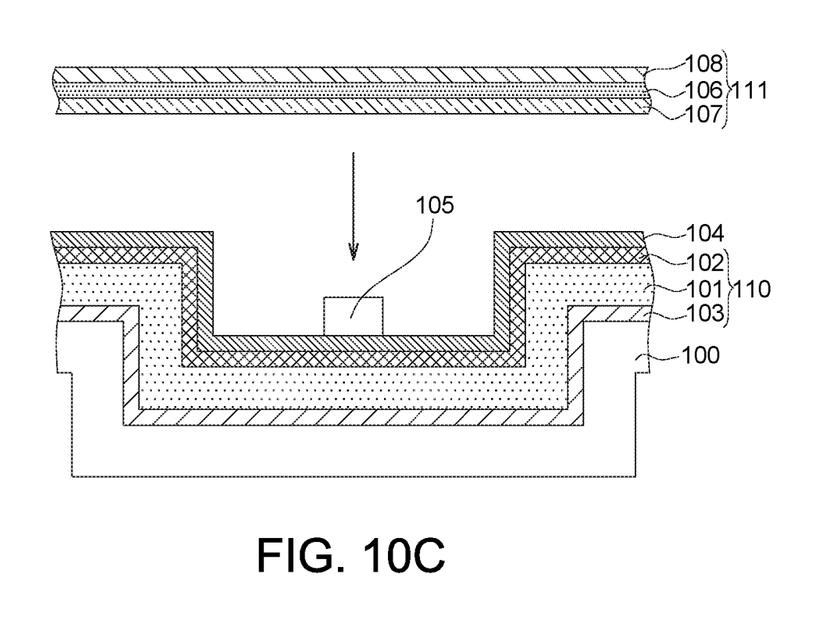

Refer to FIGS. 10A-10C. The manufacturing method of an electronic product illustrated in FIGS. 10A-10C is similar to that illustrated in FIGS. 9A-9C, and the same designations are used to indicate identical or similar elements. However, the two manufacturing methods are different as follows. As indicated in FIGS. 10A and 10B, after the conductive circuit 104 and the electronic component 105 are formed on the laminated layer 110, the laminated layer 110 and the pre-shaped supporting structure 100 are bonded together by using the out-mold forming technology, such that the laminated layer 110 and the supporting structure 100 are conformal and are stacked to each other. Then, as indicated in FIG. 10C, the protection layer 111 and the stacked laminated layer 110 and supporting structure 100 are bonded together by using the out-mold forming technology to form an electronic product 120 as indicated in FIG. 7C.

Alternatively, in another embodiment, the protection layer 111 and the pre-shaped supporting structure 100' are bonded together by using the out-mold forming technology. Then, the laminated layer 110 and the stacked protection layer 111 and supporting structure 100' are bonded together by using the out-mold forming technology to form an electronic product 121 as indicated in FIG. 7D.

The supporting structures 100 and 100' can be made of polymer, metal or ceramic, and can be formed by a single material or a composite material. The supporting structures 100 and 100' can be processed to have any shapes, such as square, circle or polygon, and is not limited to a 2D structure or a 3D structure. In an embodiment, the supporting structures 100 and 100' both are rigid structures, such as casings, panels, dashboards or frames. If the supporting structures 100 and 100' are made of a metal, then the supporting structures 100 and 100' can be formed by one of the processes such as a casting process, a turning process, and a stamping process and an extruding process. If the supporting structure 100 is made of a ceramic material, then the supporting structures 100 and 100' can be formed by one of the processes including the powder injection forming process and the sintering process. If the supporting structures 100 and 100' are made of a plastic material, the supporting structures 100 and 100' can be formed by one of an injection forming process, a blown film extrusion process and a pultrusion forming process. The present invention does not limit the manufacturing method and material of the supporting structures 100 and 100' unless a specific shape or a specific material feature is required.

According to the electronic product and the manufacturing method thereof disclosed in above embodiments of the invention, the electronic component and the conductive circuit are enclosed between the laminated layer and the protection layer, and the laminated layer, the protection layer and the supporting structure are bonded and stacked to each other by using an in-mold forming technology or an out-mold forming technology to enhance the protection for the electronic component and to avoid the electronic component colliding with injected plastic material and becoming damaged. Moreover, the invention uses a laminated layer and/or a protection layer, which can adaptively provide at least one of decorating function, heat conducting function, shielding function and light diffusing function in addition to the waterproof and dustproof functions and therefore can be used in products having a complicated 2D or 3D structure. The material of the supporting structure is not subjected to specific restrictions and the composite structure is tightly bonded on the supporting structure and difficult to be removed by an external force.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An electronic product, comprising:
   a supporting structure;
   a first thermo-formable film;
   a conductive circuit formed on the first thermo-formable film, wherein an electronic component is displaced on the conductive circuit; and
   a protection layer covering the electronic component and comprising a second thermo-formable film, wherein the conductive circuit and the electronic component are enclosed between the first thermo-formable film and the second thermo-formable film, and the supporting structure, the first thermo-formable film and the protection layer are bonded and stacked to each other.

2. The electronic product according to claim 1, wherein at least one of the first thermo-formable film and the second thermo-formable film has at least a function film formed by at least one of a decorative layer, a heat conducting layer, a shielding layer, and a function film compatible with a polymer film.

3. The electronic product according to claim 1, wherein after the first thermo-formable film and the protection layer are bonded together to form a composite structure by using a high temperature vacuum adsorption method, a heat pressing method, an ultrasonic welding method, an adhering method or an adhesive attaching method, the first thermo-formable film or the protection layer of the composite structure and the supporting structure are bonded together by using an in-mold injection forming technology or an out-mold forming technology, or after the first thermo-formable film or the protection layer and the supporting structure are bonded together by using the out-mold forming technology, the first thermo-formable film and the protection layer are bonded together by using the out-mold forming technology.

4. The electronic product according to claim 1, wherein the first thermo-formable film is a polymer film on which a patterned ink layer having a circuit pattern and a conductive metal layer are disposed, the conductive metal layer is fixed on the patterned ink layer to form the conductive circuit having the circuit pattern on the polymer film.

5. The electronic product according to claim 1, wherein the first thermo-formable film is a polymer film on which a conductive metal layer having a circuit pattern is disposed, the conductive metal layer contains an adhesive, and the conductive metal layer is fixed on the polymer film through the adhesive to form the conductive circuit having the circuit pattern on the polymer film.

6. The electronic product according to claim 1, wherein the first thermo-formable film is a polymer film on which a patterned adhesive layer and a conductive metal layer are disposed, the patterned adhesive layer is formed on the polymer film, and the conductive metal layer is fixed on the patterned adhesive layer to form the conductive circuit having a circuit pattern on the polymer film.

* * * * *